United States Patent
Strozecka-Assig et al.

(10) Patent No.: US 11,799,058 B2
(45) Date of Patent: Oct. 24, 2023

(54) OPTOELECTRONIC SEMICONDUCTOR CHIP

(71) Applicant: OSRAM OLED GmbH, Regensburg (DE)

(72) Inventors: Anna Strozecka-Assig, Regensburg (DE); Johannes Saric, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 17/863,608

(22) Filed: Jul. 13, 2022

(65) Prior Publication Data

US 2022/0384689 A1 Dec. 1, 2022

Related U.S. Application Data

(63) Continuation of application No. 16/979,596, filed as application No. PCT/EP2019/005644 on Mar. 14, 2019, now Pat. No. 11,437,545.

(30) Foreign Application Priority Data

Mar. 15, 2018 (DE) .......................... 102018106001.7
Mar. 29, 2018 (DE) .......................... 102018107667.3

(51) Int. Cl.
*H01L 33/00* (2010.01)
*H01L 33/38* (2010.01)
(Continued)

(52) U.S. Cl.
CPC ............ *H01L 33/38* (2013.01); *H01L 33/387* (2013.01); *H01L 33/405* (2013.01); *H01L 33/42* (2013.01);
(Continued)

(58) Field of Classification Search
CPC .......... G02B 1/00; G02B 5/08; H01L 33/387; H01L 33/405; H01L 33/46; H01L 33/44;
(Continued)

(56) References Cited

U.S. PATENT DOCUMENTS

2004/0201027 A1 10/2004 Ghosh
2012/0098016 A1 4/2012 Hoppel et al.
(Continued)

FOREIGN PATENT DOCUMENTS

CN 207065248 U 3/2018
DE 102015118041 A1 4/2017
(Continued)

OTHER PUBLICATIONS

Non-Final Office Action in U.S. Appl. No. 16/980,910 dated Aug. 18, 2022, 15 pages.
(Continued)

*Primary Examiner* — Savitri Mulpuri
(74) *Attorney, Agent, or Firm* — MH2 TECHNOLOGY LAW GROUP LLP (57) ABSTRACT

In one embodiment, the optoelectronic semiconductor chip comprises a semiconductor layer sequence with an active zone for generating radiation with a wavelength of maximum intensity L. A mirror comprises a cover layer. The cover layer is made of a material transparent to the radiation and has an optical thickness between 0.5 L and 3 L inclusive. The cover layer is followed in a direction away from the semiconductor layer sequence by between inclusive two and inclusive ten intermediate layers of the mirror. The intermediate layers alternately have high and low refractive indices. An optical thickness of at least one of the intermediate layers is not equal to L/4. The intermediate layers are followed in the direction away from the semiconductor layer sequence by at least one metal layer of the mirror as a reflection layer.

11 Claims, 11 Drawing Sheets

(51) Int. Cl.
*H01L 33/46* (2010.01)
*H01L 33/40* (2010.01)
*H01L 33/42* (2010.01)
*H01L 33/30* (2010.01)

(52) U.S. Cl.
CPC .............. *H01L 33/46* (2013.01); *H01L 33/30* (2013.01); *H01L 2933/0016* (2013.01); *H01L 2933/0025* (2013.01)

(58) Field of Classification Search
CPC . H01L 33/42; H01L 33/38; H01L 2933/0025; H01L 2933/0016; H01L 33/60; H01L 33/30
See application file for complete search history.

(56) References Cited

U.S. PATENT DOCUMENTS

| | | | |
|---|---|---|---|
| 2012/0280263 | A1 | 11/2012 | Ibbetson et al. |
| 2014/0217457 | A1 | 8/2014 | Cho et al. |
| 2015/0357525 | A1 | 12/2015 | Sasaki |
| 2016/0087173 | A1 | 3/2016 | Mayer et al. |
| 2016/0211420 | A1 | 7/2016 | Donofrio et al. |
| 2016/0351754 | A1* | 12/2016 | Kim .................. H01L 33/46 |
| 2017/0069372 | A1 | 3/2017 | Kodama et al. |
| 2017/0331009 | A1 | 11/2017 | Shioji |
| 2017/0373228 | A1 | 12/2017 | Chang et al. |
| 2018/0076362 | A1 | 3/2018 | Jeon et al. |
| 2018/0351046 | A1* | 12/2018 | Baur .................. H01L 33/22 |
| 2019/0027654 | A1* | 1/2019 | Höppel ................ H01L 33/405 |
| 2019/0044027 | A1 | 2/2019 | Lee et al. |
| 2019/0051805 | A1 | 2/2019 | Oh et al. |
| 2019/0058088 | A1 | 2/2019 | Jung et al. |
| 2019/0067526 | A1* | 2/2019 | Kim .................. H01L 33/46 |
| 2019/0131497 | A1* | 5/2019 | Höppel ................ H01L 33/62 |
| 2021/0005784 | A1* | 1/2021 | Pickel .................. H01L 33/46 |

FOREIGN PATENT DOCUMENTS

| | | |
|---|---|---|
| DE | 102017101637 A1 | 8/2018 |
| KR | 20120014972 A | 2/2012 |
| WO | 2017057978 A1 | 4/2017 |
| WO | 2017069372 A1 | 4/2017 |

OTHER PUBLICATIONS

Ashcroft, "Homogeneous Semiconductors", Solid state physics, 2005, 61 pages.
Anonymous, "Datasheet: Metal Can® T018, SFH 4860", OSRAM OS, Jul. 16, 2019, 14 pages.
Anonymous, "Transistor Outline (TO) Package Types", EESemi.com, Accessed Aug. 11, 2017, 4 pages.
Haferkorn, "Radiation physical quantities", Radiation physics and Light technology, 2003, 11 pages.
Illek et al., "Scalability of buried micro-reflector light emitting diodes for high-current applications", Integrated Optoelectronics Devices, 2003, 8 pages.
Vinh et al., "Measurement and Modeling of the LED Light Source", LED Lighting: Technology and Preception, 2015, 51 pages.
Evangeline, H, "Osram Revs up Wuxi Plant with the 2nd Phase of Back-end Production Project", LED Inside, Aug. 11, 2017, 2 pages.
Anonymous, "Osram focuses on high-tech Regensburg", Economy, Jan. 12, 2018, 8 pages.
Anonymous, "Investments of about €3 billion create new growth prospects for OSRAM", OSRAM Opto Semiconductors, Nov. 10, 2015, 3 pages.
Rossnagel, "Handbook of Semiconductor Manufacturing Technology", Marcel Dekker, Inc., Sep. 16, 2000, 20 pages.
Schubert, "Light-Emitting Diodes Second Edition", New York: Cambridge University Press, 2006, 14 pages.
Streubel et al., "High brightness AlGaInP light-emitting diodes", IEEE Journal of Selected Topics in Quantum Electronics, vol. 8, No. 2, 2002, 12 pages.
Xia et al., "Chemical Vapor Deposition", Handbook of Semiconductor Manufacturing Technology, 2000, 48 pages.

* cited by examiner

OPTOELECTRONIC SEMICONDUCTOR CHIP

CROSS-REFERENCE TO RELATED APPLICATIONS

This patent application is continuation of U.S. patent application Ser. No. 16/979,596 filed Sep. 10, 2020, now allowed, which is a national stage entry from International Application No. PCT/EP2019/056449, filed on Mar. 14, 2019, published as International Publication No. WO 2019/175327 A1 on Sep. 19, 2019, and claims priority under 35 U.S.C. § 119 from German patent applications 10 2018 106 001.7, filed Mar. 15, 2018, and 10 2018 107 667.3 filed Mar. 29, 2018, the entire contents of all of which are incorporated by reference herein in their entireties.

FIELD OF THE INVENTION

An optoelectronic semiconductor chip is specified.

BACKGROUND OF THE INVENTION

A task to be solved is to specify an optoelectronic semiconductor chip which comprises a mirror with a high reflectivity.

This task is solved, inter alia, by an optoelectronic semiconductor chip with the features of the independent patent claim. Preferred embodiments are the subject of the other claims.

SUMMARY OF THE INVENTION

According to at least one embodiment, the optoelectronic semiconductor chip is intended to generate radiation, in particular near-ultraviolet radiation, visible light and/or near-infrared radiation. The semiconductor chip is, for example, a light emitting diode chip or a laser diode chip. Preferably the semiconductor chip is an LED chip for generating yellow, orange or red light.

According to at least one embodiment, the semiconductor chip comprises a semiconductor layer sequence. The semiconductor layer sequence contains at least one active zone for generating radiation. The radiation has a wavelength of maximum intensity L. The active zone is preferably located between a p-doped side and an n-doped side of the semiconductor layer sequence. In particular, the active zone contains a single quantum well structure, a multiple quantum well structure and/or a pn junction. The active zone extends in particular perpendicularly to a growth direction of the semiconductor layer sequence.

The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$ respectively. Preferably for at least one layer or for all layers of the semiconductor layer sequence $0 < n \leq 0.8$, $0.4 \leq m < 1$ and $n+m \leq 0.95$ as well as $0 < k \leq 0.5$. The semiconductor layer sequence may contain dopants as well as additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances.

According to at least one embodiment, the semiconductor chip comprises one or more mirrors. The preferably exactly one mirror serves to reflect the radiation. The mirror is attached to a rear side of the semiconductor layer sequence, which is opposite a light extraction side of the semiconductor layer sequence.

According to at least one embodiment, the mirror comprises at least one, preferably exactly one cover layer. The cover layer may be the thickest layer of the mirror, in particular the thickest layer of the mirror made of a material transparent to the radiation generated during operation. The cover layer is the layer of the mirror closest to the semiconductor layer sequence. The cover layer can contact the semiconductor layer sequence flat.

According to at least one embodiment, the cover layer is formed with a material which is transparent to the radiation generated during operation and which is in particular low refractive. Low refractive may mean that the refractive index of the cover layer is at least 0.5 or 1 or 1.5 lower than an average refractive index of the semiconductor layer sequence. Preferably the cover layer is made of a dielectric material, but can alternatively be made of an electrically conductive material. A material of the cover layer is for example an oxide, a nitride or an oxynitride.

According to at least one embodiment, the cover layer has a comparatively large optical thickness. The term optical thickness refers to a product of a geometrical thickness of the respective layer and its refractive index with respect to the wavelength of maximum intensity. Preferably, the cover layer has an optical thickness of at least 0.5 L or 1.0 L. Alternatively or additionally, this optical thickness is at most 5 L or 3 L or 2 L or 1.5 L.

The wavelength of maximum intensity L refers here and in the following to the vacuum wavelength. For example, if the vacuum wavelength is 600 nm, a value of 0.5 L corresponds to a thickness of 300 nm. If this value of 300 nm, for example, denotes an optical thickness and the refractive index at the wavelength L is 1.5, for example, the geometric thickness assigned to the corresponding optical thickness is 300 nm divided by the refractive index, i.e., 200 nm. In other words, the optical thicknesses mentioned are related to the wavelengths of maximum intensity L, whereby the refractive index of the respective layer must be taken into account as a divider for conversion to geometric thicknesses. The refractive indices refer to a temperature of 300 K or to a specified operating temperature of the semiconductor chip.

According to at least embodiment, the mirror comprises several intermediate layers. The number of intermediate layers is preferably not more than fifteen or ten or seven. The intermediate layers follow the cover layer in a direction away from the semiconductor layer sequence. In particular the intermediate layer follow the cover layer directly. In particular, there are two, three, four or five of the intermediate layers, preferably three or four.

According to at least one embodiment, the intermediate layers are each made of a material transparent to the radiation generated during operation, such as an oxide, a nitride or an oxynitride. The intermediate layers may be dielectric or alternatively electrically conductive. The intermediate layers are made of at least two different materials, wherein each intermediate layer is preferably made of a single material. In the direction away from the cover layer, the intermediate layers have alternating high and low refractive indices for the radiation generated during operation. A refractive index difference between adjacent intermediate layers and/or towards the cover layer is preferably at least 0.5 or 1. It is possible that one type of intermediate layers, in particular the intermediate layers with a low refractive index, are of the same material as the cover layer.

According to at least one embodiment, a thickness of at least one of the intermediate layers is not equal to L/4. In other words, at least one of the intermediate layers is not a layer as used in conventional Bragg mirrors. It is possible that none of the intermediate layers has a thickness of L/4. This is in particular true with a tolerance of 0.03 L or 0.02 L or 0.01 L.

According to at least one embodiment, the mirror includes a metal layer. The metal layer follows the intermediate layers in a direction away from the semiconductor layer sequence, in particular the metal layer follows directly after the intermediate layers. The metal layer is designed as a reflection layer and serves to reflect the radiation generated during operation. Radiation components are reflected at the metal layer, which reach the metal layer from the semiconductor layer sequence through the cover layer and the intermediate layers.

In at least one embodiment, the optoelectronic semiconductor chip comprises a semiconductor layer sequence with an active zone for generating radiation with a wavelength of maximum intensity L. A mirror for the radiation is located on a rear side opposite a light extraction side. The mirror comprises a cover layer closest to the semiconductor layer sequence. The cover layer is made of a material transparent to the radiation and has an optical thickness between 0.5 L and 3 L inclusive. The cover layer is followed in a direction away from the semiconductor layer sequence by between two and ten inclusive intermediate layers of the mirror. The intermediate layers have alternating high and low refractive indices for the radiation and are each made of a material transparent to the radiation. An optical thickness of at least one of the intermediate layers is not equal to L/4. The intermediate layers are followed in the direction away from the semiconductor layer sequence by at least one metal layer of the mirror as a reflection layer.

Thus, the mirror is an in particular dielectric Bragg mirror for a wide wavelength range, for example from the yellow to the infrared spectral range. The mirror is preferably used for light emitting diode chips based on InGaAlP and/or AlGaAs.

With the mirror described here, increased reflectivity can be achieved, especially of dielectric mirrors, in particular for thin-film LEDs in which a growth substrate is removed from a semiconductor layer sequence. This applies, for example, to LED chips based on InGaAlP, which are manufactured using thin-film technology, or TF technology for short.

A key element in the thin-film technology of InGaAlP/AlGaAs diodes is a dielectric-metal mirror. A first part of such a mirror consists of a thick layer of a dielectric. The dielectric material of the first layer should have a low refractive index in order to maximize the refractive index difference between an adjacent semiconductor material and the first mirror layer and thus maximize the critical angle of total reflection. The metal, usually Au or Ag, behind the dielectric layer reflects light that is not reflected at the first interface.

InGaAs/AlGaAs chips manufactured with Osram TF technology, for example TF5 designs and TF6 designs, use mirrors consisting of a thick $SiO_2$ layer, for example with a thickness of 530 nm, and an Au layer behind it. Other variants of the dielectric mirror are found in InGaAlP/AlGaAs diodes from other manufacturers, but always with only a single layer of dielectric, for example of $MgF2$ in the case of EpiStar. For GaN light-emitting diodes it has been proposed to increase the mirror reflectivity by introducing a so-called dielectric DBR, i.e. a Distributed Bragg Reflector. Such mirrors consist of pairs of, for example, $SiO_2/TiO_2$ layers with L/4 thickness, see for example the publication Hongjun Chen et al., "Enhanced Performance of GaN-Based Light-Emitting Diodes by Using Al Mirror and Atomic Layer Deposition-$TiO_2/Al_2O_3$ Distributed Bragg Reflector Backside Reflector with Patterned Sapphire Substrate" in Applied Physics Express, Volume 6, Number 2, from page 022101, from 2013, DOI: https://doi.org/10.7567/APEX.6.022101.

A basic idea of the mirror described here is to use a stack of preferably dielectric layers with optimized thickness instead of a single $SiO_2$ layer. A classical DBR mirror consists of several L/4 layers of two dielectric materials. The materials should have a large refractive index difference to maximize reflection of radiation at each interface. A disadvantage of this classical idea is that such a design leads to a strong angular dependence and spectral dependence of the reflection. As a result, the L/4 structure does not result in an improvement in specular reflectivity when integrated over the angle.

The Bragg mirror proposed here differs in several points from a classical DBR:

1) The first dielectric layer near the semiconductor material has a low refractive index and is thick to achieve a large critical angle of total reflection at the first interface.

2) The layers behind it are not L/4 thick to avoid angular and spectral minima. The thickness of these layers is chosen to ensure a high constructive interference of light reflected at each interface, but at the same time to show a very weak wavelength dependence and angle dependence.

3) The number of underlying layers is preferably reduced to three or four, to reduce the complexity of the design and to minimize any negative influence on a thermal conductivity value by the LED.

The dielectric stack described above is used to increase the specular reflectance and brightness especially of InGaAlP light emitting diodes.

In particular, the following aspects have to be considered:

A) Choice of the dielectric material:

As mentioned above, the dielectric materials should be selected so that they have a sufficiently high refractive index difference. The first layer should be a low refractive index layer. Examples of suitable material pairs are: i) $SiO_2$ with n=1.46 and $Nb_2O_5$ with n=2.3, ii) $SiO_2$ and $TiO_2$ with n=2.3 to 2.4, iii) $MgF_2$ with n=1.37 and $Nb_2O_5$, iv) $MgF_2$ and $TiO_2$. The above values are valid for a temperature of 300 K and for a wavelength of 616 nm. The thicknesses of the individual layers are preferably optimized again for different material choices.

B) Number and thickness of the layers:

The total number of layers can be low, for example three or four. It is advantageous to limit the number of layers, since a thick dielectric mirror has a negative influence on the thermal properties of the LED. To maximize reflectance over a wide angular and spectral range, it is advantageous that the layers are different from L/4 and that low and high refractive index layers have different optical thicknesses.

For example, the first layer is thick, in particular around 520 nm. The following Nb2O5 layers and SiO2 layers each have thicknesses slightly greater or less than L/3. For this design, there are no strong reflection minima across the angle.

However, there are equivalent designs:

i) The thickness of the first layer can be chosen larger or smaller. However, if the first layer is too thin, approximately thinner than approximately L/2, the reflection improvement is lost.

ii) For the thinner dielectric layers it is not necessary that layers of the same material have the same optical thickness. There are equivalent designs where each layer has a different optical thickness. Thicknesses greater than L/4, but less than L/2, preferably L/3+−20%, are optimal.

iii) It is possible to use different numbers of dielectric layers. The total number of layers can be greater than 4. Good configurations exist with odd and even numbers of layers.

iv) When using an odd number of dielectric layers, individual layers can be made L/4 thick or thinner. However, if an L/4 thickness is chosen, minima in reflectance exist at certain angles. This reduces the total integrated reflectance of the mirror.

C) Selection of the metal behind the dielectric layers:

The spectrally broadband reflecting Bragg mirror described here can be used with Au or also with Ag or Al as metal mirror layer or any other metal mirror behind it. For a good adhesion of the dielectric layers to the metal mirror, an additional thin adhesive layer is preferably used, for example of a transparent conductive oxide, in short TCO, such as ITO, ZnO or the like. Other possible materials are for example insulating oxides like $Al_2O_3$ or metals like Ti.

D) Use in different chip designs, for example in combination with a p-contact:

i) The dielectric layer stack of the mirror is deposited directly on the semiconductor material. For contacting the semiconductor, the mirror is photolithographically structured, for example. The semiconductor material is preferably contacted by metallic contacts such as point contacts.

ii) Contacting and current spreading is achieved by a thin TCO layer, for example of ITO. The Bragg stack is then deposited on the TCO layer and structured to contact the TCO via metallic contact points. Such TCO contacts, in particular on GaP, are known, for example, from the publication DE 10 2017 101 637 A1, whose disclosure content is taken up by reference. Other TCOs such as IZO or ZnO are also possible, individually or in combination.

iii) The use of a Bragg mirror in combination with a TCO layer as contact layer also has advantages for subsequent processing. Bragg mirrors are usually structured by dry etching to avoid undercutting if the two dielectric materials have different etch rates in a wet etch process. However, dry etching directly on a semiconductor material can introduce defects and make it difficult to form a low-resistance electrical contact. However, dry etching on TCO does not affect the contact resistance.

iv) For a classical DBR mirror, one would expect a significant variation of the light distribution due to strong angular and spectral dependencies in the reflection pattern. In the case of the broadband Bragg mirror described here, the light distribution remains Lambertian. The light distribution was measured for an LED chip with a single $SiO_2$ layer and with a mirror design described here; no variations in the reflection characteristics were found.

According to at least one embodiment, the semiconductor chip comprises one or more adhesion promoting layers and/or one or more contact layers. The adhesion promoting layer is preferably located between the metal layer and the last dielectric mirror layer. Preferably, the adhesion promoting layer borders flat and directly on the metal layer and the adjacent dielectric layer. The contact layer is preferably applied directly between the cover layer and the semiconductor layer sequence.

According to at least one embodiment, the adhesion promoting layer and/or the contact layer is made of a transparent conductive oxide.

Transparent conductive oxides, or TCOs for short, are transparent, electrically conductive materials, usually metal oxides, such as zinc oxide, tin oxide, cadmium oxide, titanium oxide, indium oxide or indium tin oxide, ITO for short. In addition to binary metal oxygen compounds, such as ZnO, SnO2 or In2O3, ternary metal oxygen compounds such as Zn2SnO4, CdSnO3, ZnSnO3, MgIn2O4, GaInO3, Zn2In2O5 or In4Sn3O12 or mixtures of different transparent conductive oxides also belong to the group of TCOs. Furthermore, the TCOs do not necessarily correspond to a stoichiometric composition and can also be p-doped or n-doped.

According to at least one embodiment, the adhesion promoting layer and/or the contact layer has a relatively small optical thickness. Due to a small thickness of the adhesion promoting layer and/or the contact layer it is possible that the latter is optically functionless. In particular, the optical thickness of the adhesion promoting layer and/or the contact layer is at most L/5 or L/7 or L/9. For example, the geometric thickness of the adhesion promoting layer and/or the contact layer is at least 0.5 nm or 2 nm or 5 nm and/or at most 250 nm or 100 nm or 40 nm or 30 nm.

According to at least one embodiment, at least 30% or 50% or 80% of the intermediate layers or all intermediate layers have an optical thickness of L/3. In particular, this optical thickness is present with a tolerance of at most L/15 or 0.06 L or L/20 or L/30. It is also possible that only one or only two of the intermediate layers have an optical thickness of L/3, with the tolerances mentioned above.

According to at least one embodiment, the mirror has exactly three intermediate layers. Alternatively, the mirror has exactly four intermediate layers. This means that, together with the cover layer, the mirror then comprises exactly four or exactly five layers of materials which, preferably in the direction away from the semiconductor layer sequence, have alternating high and low refractive indices and are made of materials transparent to the radiation.

According to at least one embodiment, the mirror has at most one or at most two or at most three intermediate layers which have an optical thickness of (L/4+N/2)+−L/20. N is a natural number equal to or greater than zero. Alternatively or additionally, the proportion of such intermediate layers is at most 60% or 40% or 20%, based on a total number of intermediate layers of the mirror.

It is alternatively possible that none of the intermediate layers has such an optical thickness. This means that the mirror may be free or substantially free of L/4 layers used in conventional Bragg mirrors.

According to at least one embodiment, an optical thickness of the cover layer is at least 0.9 L or L or 1.1 L or 1.2 L. Alternatively or additionally, the optical thickness of the cover layer is at most 1.8 L or 1.6 L or 1.4 L. In particular, the optical thickness of the cover layer is between 1.15 L and 1.3 L.

According to at least one embodiment, the intermediate layers or at least one of the intermediate layers or at least half of the intermediate layers have an optical thickness of at least 0.27 L or 0.3 L or 0.32 L. Alternatively or additionally, the optical thickness of the intermediate layers concerned is at most 0.43 L or 0.4 L or 0.36 L. Preferably, there are exactly two such intermediate layers.

According to at least one embodiment, the mirror has an intermediate layer of low refractive index, which is preferably located directly between two of the intermediate layers according to the previous paragraph. The intermediate layer in between preferably has an optical thickness of at least 0.26 L or 0.28 L and/or of at most 0.38 L or 0.35 L or 0.31 L. Preferably, a refractive index difference of this low refractive intermediate layer to adjacent intermediate layers is at least 0.04 L or 0.06 L or 0.08 L, respectively.

According to at least one embodiment, an optical thickness of at least three of the intermediate layers increases in the direction away from the cover layer. This applies in particular to successive intermediate layers. The mentioned intermediate layers preferably start at the cover layer. A difference in optical thickness between adjacent intermediate layers of this type is preferably at least 0.03 L or 0.06 L and/or at most 0.2 L or 0.15 L or 0.1 L.

According to at least one embodiment, an optical thickness of at least three of the intermediate layers increases in a direction away from the metal layer. This preferably applies to directly successive intermediate layers and in particular starting directly at the metal layer. A difference in the optical thicknesses of these adjacent intermediate layers is preferably relatively large and is, for example, at least 0.06 L or 0.09 L or 0.11 L and/or at most 0.18 L or 0.14 L or 0.12 L.

According to at least one embodiment, an optical thickness of one or more of the intermediate layers is at most L/5. In particular, exactly one such comparatively thin intermediate layer is present. This interlayer or these interlayers are preferably closer to the metal layer than to the cover layer. For example, the preferably exactly one intermediate layer with the small thickness is located directly next to the metal layer.

According to at least one embodiment, a total optical thickness of the cover layer together with all intermediate layers is at least 1.6 L or 1.8 L or 2.1 L. Alternatively or additionally, the total thickness is at most 3.5 L or 2.7 L or 2.3 L. In other words, the total thickness is relatively small.

For all the above and subsequent optical thicknesses of the cover layer and the intermediate layers, it can be said that n L/2 is added in each case, where n is a natural number greater than or equal to one, in particular equal to one, i.e., n=1. An increase in the optical thickness by n L/2 does not change the optical effectiveness of the layer in question or does not change it significantly. In order to simplify the previous descriptions of the thicknesses, however, the optional additional summand n L/2 is usually not included. However, this summand is preferably omitted, so that n=0.

According to at least one embodiment, the or at least the last intermediate layer, i.e. the intermediate layer closest to the metal layer, has a thickness unequal to L/4. Preferably the optical thickness of this intermediate layer is between 0.28 L and 0.45 L or, for n=1, between 0.78 L and 0.95 L. Preferably at least 50% or 75% of the other intermediate layers or all other intermediate layers have an optical thickness between 0.255 L and 0.45 L or between 0.755 L and 0.95 L. This applies in particular if the last intermediate layer closest to the metal layer is a highly refractive layer.

According to at least one embodiment, the last interlayer closest to the metal layer has an optical thickness between 0.28 L and 0.48 L inclusive. This applies in particular if the last intermediate layer is a low refractive index layer.

According to at least one embodiment, the intermediate layers, optionally together with the cover layer, are composed of exactly two different materials. This means that the mirror, together with the metal layer, is preferably made of only three different materials.

According to at least one embodiment, the mirror is composed of more than two transparent materials, for example three or four such materials. It is possible that the intermediate layers comprise at least two such materials and that the cover layer is made of another material. It is also possible that each intermediate layer or each of the intermediate layers together with the cover layer is of a separate material.

According to at least one embodiment, the cover layer, all intermediate layers and the metal layer follow each other directly and preferably flat. There are then no further components between the above-mentioned components.

According to at least one embodiment, the cover layer and the intermediate layers and optionally the metal layer are each flat layers with a constant thickness. The cover layer and the intermediate layers and optionally the metal layer may be congruent with each other. It is possible for the cover layer and/or the intermediate layer to protrude laterally beyond the metal layer in order to encapsulate the metal layer against external environmental influences.

According to at least one embodiment, the semiconductor layer sequence and/or the contact layer is structured. Thus these layers have a topography that is not planar. The mirror can follow this topography, in particular true to shape. This means that the cover layer, the intermediate layers and/or the metal layer is then not planar in shape.

According to at least one embodiment, the cover layer and low-refractive intermediate layers each comprise silicon dioxide or magnesium difluoride as material. In particular, $Nb_2O_5$ or titanium dioxide is used as material for the high refractive intermediate layers. In particular, the cover layer and the low refractive intermediate layers are made of silicon dioxide and the high refractive intermediate layers of $Nb_2O_5$. The cover layer and the intermediate layers together preferably have alternating high and low refractive indices, starting with the low refractive cover layer.

According to at least one embodiment, the metal layer is made of gold, a gold alloy, silver, a silver alloy or aluminum or an aluminum alloy. A thickness of the metal layer is preferably at least 50 nm or 100 nm or 200 nm. The metal layer is preferably located directly on the intermediate layers.

As an alternative to a metal layer directly on the intermediate layers, at least one adhesion enhancing layer can be applied between the intermediate layers and the metal layer, for example a titanium layer, a platinum layer and/or a palladium layer, wherein such an adhesion enhancing layer preferably is optically substantially ineffective and in particular has a thickness of at most 5 nm or 2 nm or 1 nm. In addition, the adhesion enhancing layer can be made of a dielectric oxide such as aluminum oxide or of a TCO.

According to at least one embodiment, the metal layer of the mirror is connected optically conductively to an electrode of the semiconductor chip or the metal layer forms a part of an electrode. This means that a current is applied to the semiconductor layer sequence via the metal layer, in particular to the p-doped side of the semiconductor layer sequence. This means that the mirror may be located on the p-doped side.

According to at least one embodiment, the semiconductor chip comprises one or more electrical through-connections for electrical contacting, in particular of the p-doped side. One of the through-connection or all through-connections preferably run through the mirror, i.e., in particular through the cover layer and all intermediate layers. Thus the metal layer of the mirror can be electrically connected to the semiconductor layer sequence or the additional contact layer via the through-connections.

According to at least one embodiment, the contact layer extends continuously over all through-connections. Thus the contact layer may simultaneously serve as a current expansion layer. The adhesion promoting layer may also be structured in at least one contact region and then need not be electrically conductive.

According to at least one embodiment, the semiconductor layer sequence is based on the material system AlInGaAs and/or on the material system InGaAlP. In other words, the semiconductor chip is a component based on an arsenide or a phosphide. The wavelength of maximum intensity L is preferably at least 570 nm or 590 nm and/or at most 950 nm or 840 nm or 700 nm. In particular, red light is generated with the semiconductor chip during normal operation.

BRIEF DESCRIPTION OF THE DRAWINGS

In the following, an optoelectronic semiconductor chip described here is explained in more detail with reference to the drawing using exemplary embodiments. Identical reference signs indicate identical elements in the individual figures. However, no scale references are shown; individual elements may be shown in exaggerated size for better understanding.

In the figures.

DETAILED DESCRIPTION

Figure 1:
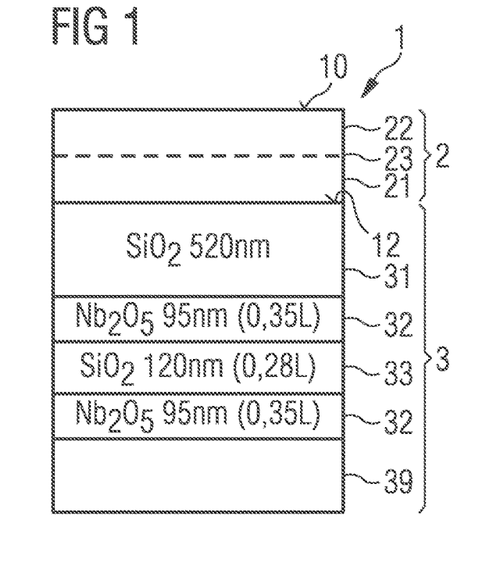
FIG. 1 shows a schematic sectional view of an example of an optoelectronic semiconductor chip described here, FIGS. 2 and 3 schematic sectional views of modifications of semiconductor chips, FIGS. 4 and 5 schematic sectional views of exemplary embodiments of optoelectronic semiconductor chips described here.

FIG. 1 shows an exemplary embodiments of a semiconductor chip 1. The semiconductor chip 1 comprises a semiconductor layer sequence 2, in which an active zone 23 is located between a p-doped side 21 and an n-doped side 22.

A mirror 3 is located directly on the semiconductor layer sequence 2 to reflect radiation generated during operation in the active zone 23, which has a wavelength of maximum intensity L. The mirror 3 comprises a cover layer 31 which is directly adjacent to the semiconductor layer sequence 2. The cover layer 31 may be the thickest layer of the mirror 3. The cover layer 31 has a relatively low refractive index.

In a direction away from the cover layer 31, the mirror 3 comprises several intermediate layers 32, 33. The intermediate layers 32, 33, preferably together with the cover layer 31, have alternating high and low refractive indices.

The intermediate layers 32, 33 are directly followed in the direction away from the semiconductor layer sequence 2 by a metal layer 39 as a reflection layer. The metal layer 39 is preferably made of gold, alternatively of silver.

The intermediate layers 32, 33 of mirror 3 form a modified Bragg mirror, in particular together with the cover layer 31. All intermediate layers 32, 33 have an optical thickness different from L/4, unlike in a classic Bragg mirror. This allows a reduced spectral dependence and angle dependence of the reflection behavior to be achieved.

The cover layer 31, for example, is made of silicon dioxide with a thickness of 520 nm. The first intermediate layers 32 are for example made of $Nb_2O_5$ with a thickness of 95 nm. The second intermediate layer 33 is for example made of silicon dioxide with a thickness of 120 nm. At a wavelength of maximum intensity L of 616 nm and at room temperature, the corresponding optical thicknesses of these layers are 0.35 and 0.28 L, as shown in FIG. 1. The cover layer 31 has an optical thickness of 1.23 L. Depending on the wavelength of maximum intensity L, the geometric thicknesses must be adjusted.

The values given for the optical thicknesses are preferably valid with a tolerance of 0.03 L or 0.02 L maximum, in particular with regard to the intermediate layers 32, 33.

Figure 2:
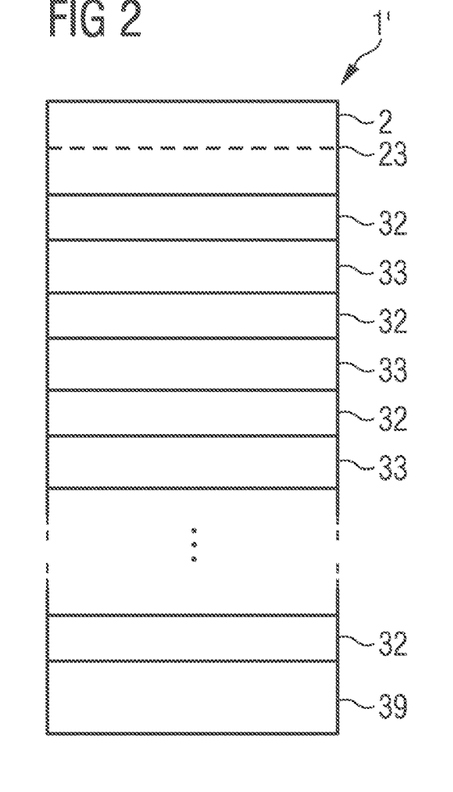

FIG. 2 shows a modification 1' of a semiconductor chip. As in a classical Bragg mirror, the intermediate layers 32, 33 are each L/4 layers, i.e., layers with an optical thickness of L/4. 10.5 pairs of layers, i.e., 21 layers, are present, for example. The first intermediate layers 32 are for example made of silicon dioxide and the second intermediate layers 33 of $Nb_5O_2$. Thus, there is a comparatively large number of layers. Furthermore, FIG. 2 lacks a thick cover layer, as in the exemplary embodiment of FIG. 1.

Figure 3:
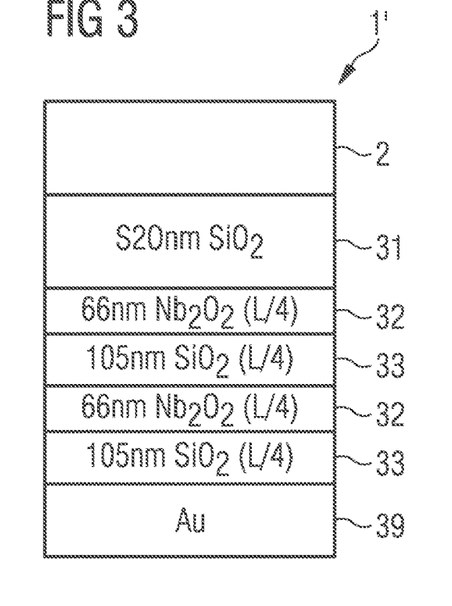

In the modification 1' in FIG. 3, there is a thick cover layer 31 and two pairs of intermediate layers 32, 33, each with an optical thickness of L/4. The materials and geometric layer thicknesses are given as examples for a wavelength of maximum intensity L of 616 nm in FIG. 3.

Figure 4:
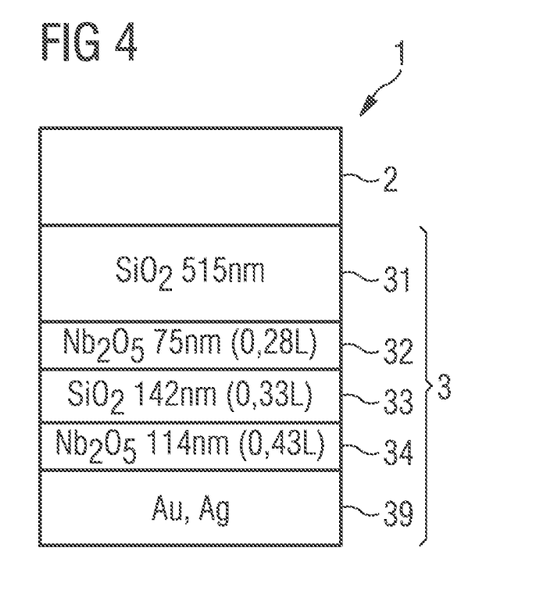

In the exemplary embodiment of the semiconductor chip 1, as shown in FIG. 4, three of the intermediate layers 32, 33, 34 are present, which follow the cover layer 31. The cover layer 31 has an optical thickness of approximately 1.22 L. The optical thicknesses of the intermediate layers 32, 33, 34 increase from the cover layer 31 towards the metal layer 39. The differences in optical thickness between adjacent intermediate layers 32, 33, 34 increase towards the metal layer 39.

Figure 5:
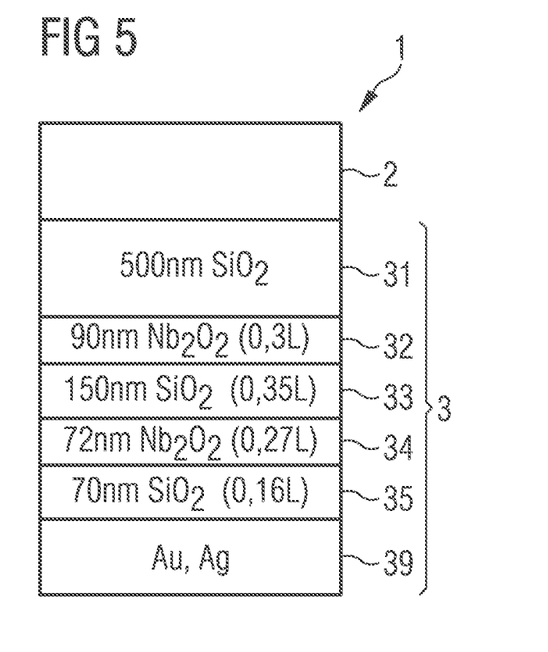

The exemplary embodiment of FIG. 5 shows four of the intermediate layers 32, 33, 34, 35. For three of the intermediate layers 33, 34, 35, the optical thickness increases in the direction away from the metal layer 39, starting at the metal layer 39. The intermediate layer 32 nearest to the cover layer 31 has the second highest optical thickness. The intermediate layer 35 closest to the metal layer 39 is significantly thinner than L/4.

The materials and thicknesses mentioned in FIGS. 4 and 5 are only examples. All layers 31, 32, 33, 34, 35 each have optical thicknesses unequal to L/4. The optical thicknesses of the intermediate layers 32, 33, 34, 35, as shown in FIGS. 4 and 5, may also apply in slightly modified form, for example with a tolerance of not more than 0.04 L or 0.02 L each.

Figure 6:
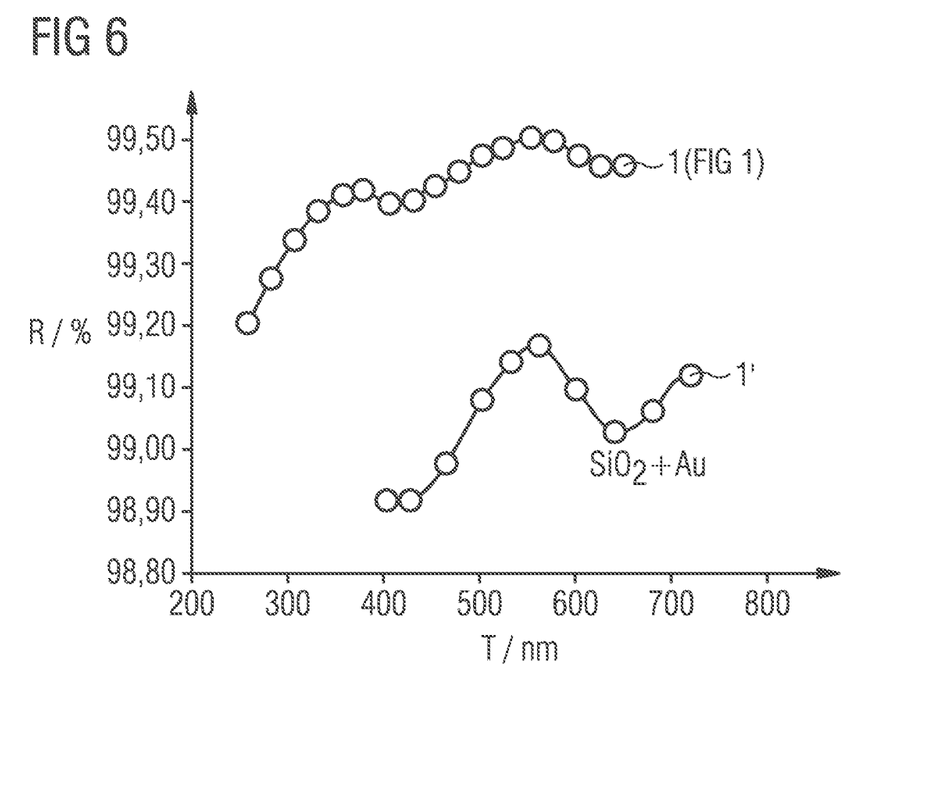
FIG. 6 shows schematically a reflectivity as a function of the thickness of the cover layer of a modification and an exemplary embodiment of an optoelectronic semiconductor chip described here.

FIG. 6 shows a reflectivity R in percent as a function of the thickness of the cover layer T in nm. Here the exemplary embodiment of the semiconductor chip 1 from FIG. 1 compared with a modification 1'. This modification 1', as illustrated in FIG. 6, corresponds to the modification 1' of FIG. 3, but without the intermediate layers 32, 33.

It can be seen from FIG. 6 that for the exemplary embodiment of the semiconductor chip 1 the reflectivity R is reduced by a too thin cover layer 31 and that compared to the modification 1' a reflectivity R is achieved which is about 0.4 percentage points higher.

Figure 7:
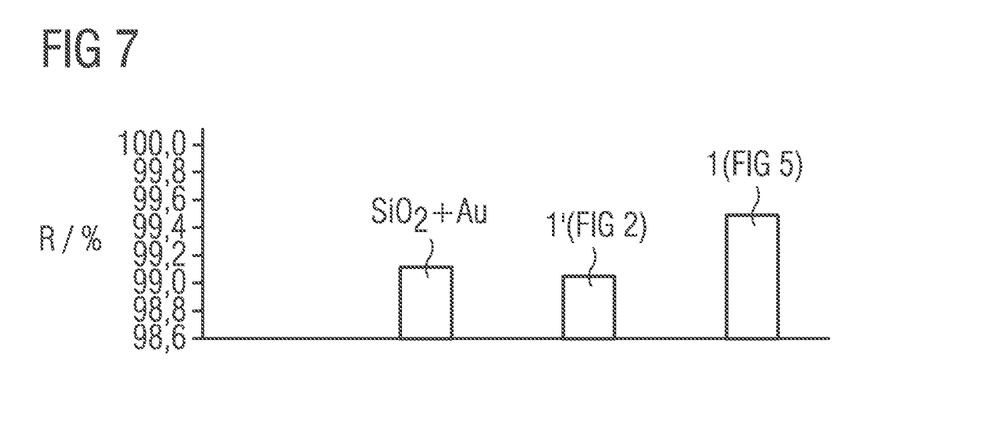
FIG. 7 shows a schematic comparison of the reflectivity of different semiconductor chips.

FIG. 7 compares the reflectivities R for the modification 1', as explained in connection with FIG. 6 and based on FIG. 3, as well as the modification 1' of FIG. 2 and the exemplary embodiment of the semiconductor chip 1 of FIG. 5. It can be seen that a significantly increased reflectivity R can be achieved with the design of the semiconductor chip 1 of FIG. 5. The reflectivity R, as shown in FIG. 7, refers to the reflectivity integrated over all angles.

In FIGS. 8A to 8F, the reflectivity R is plotted against an angle of incidence E in degrees and the wavelength 2, in nm, for various exemplary embodiments and modifications. The coding of the reflectivity R is shown in FIG. 8G.

Figure 8A:
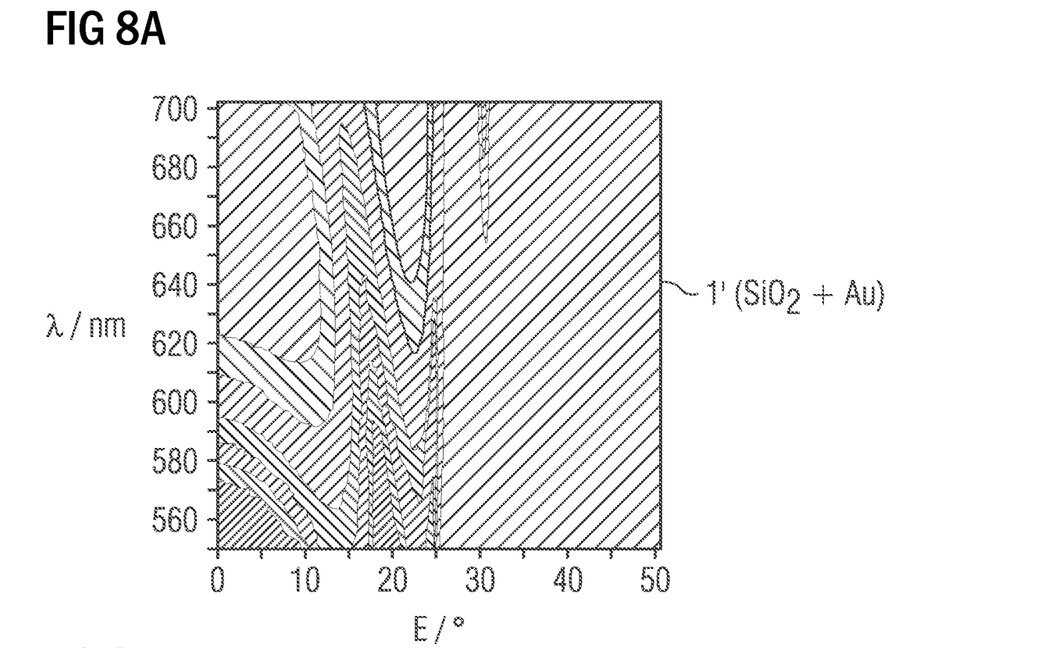
FIGS. 8A to 8G shows schematic representations of reflectivity for modification and exemplary embodiments of semiconductor chips versus angle of incidence and versus wavelength.

FIG. 8A refers to a modification 1' with a mirror with a thick silicon dioxide layer and a gold layer directly underneath, i.e., the structure of FIG. 3 without the intermediate layers 32, 33.

Figure 8B:
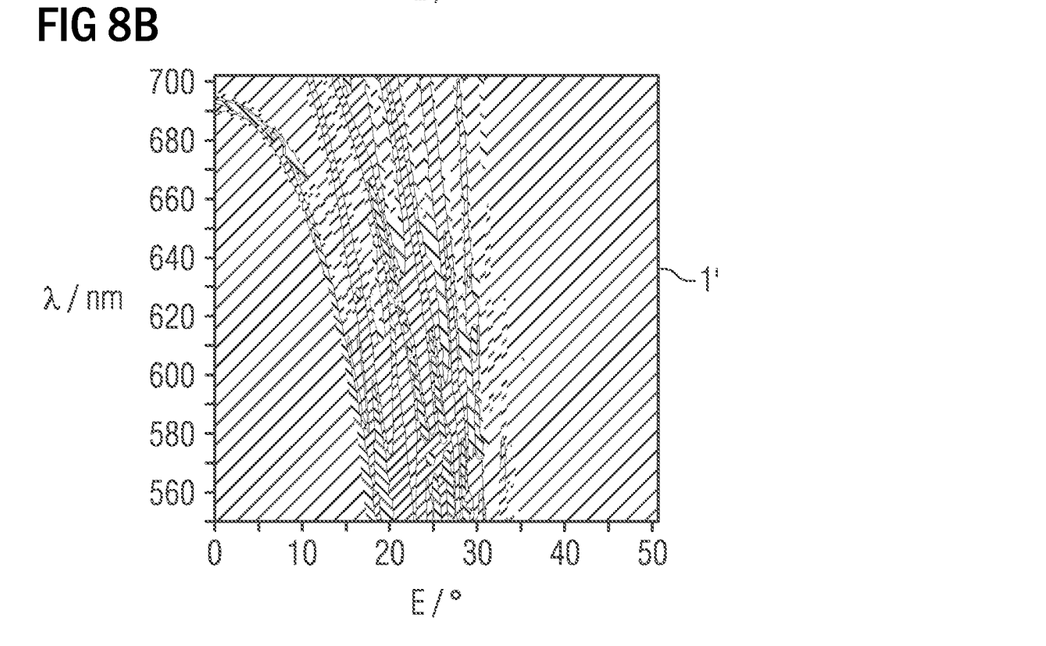

FIG. 8B illustrates a modification 1' using 10 pairs of layers, corresponding to 20 layers, of silicon dioxide and $Nb_2O_5$, with the lowest layer directly on the metal mirror being of $Nb_2O_5$. The component in FIG. 8B thus corresponds to the modification 1' of FIG. 2, but without the low refractive intermediate layer 32 nearest to the metal layer 39.

Figure 8C:
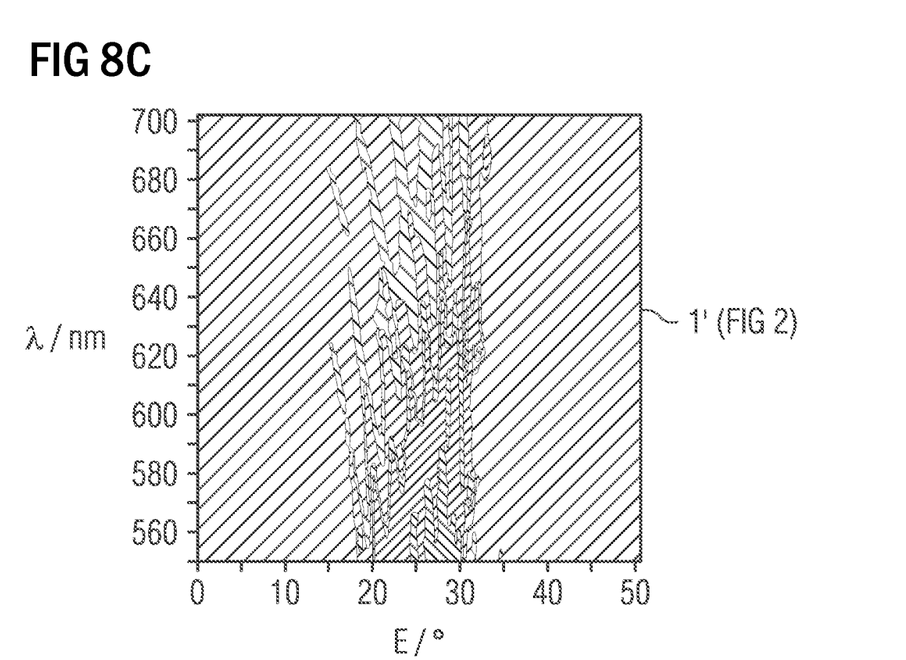

In the modification 1', as illustrated in FIG. 8C, there are 10.5 pairs of layers, corresponding to 21 layers, as illustrated in FIG. 2. Directly at the metal mirror there is therefore a low refractive index layer.

Figure 8D:
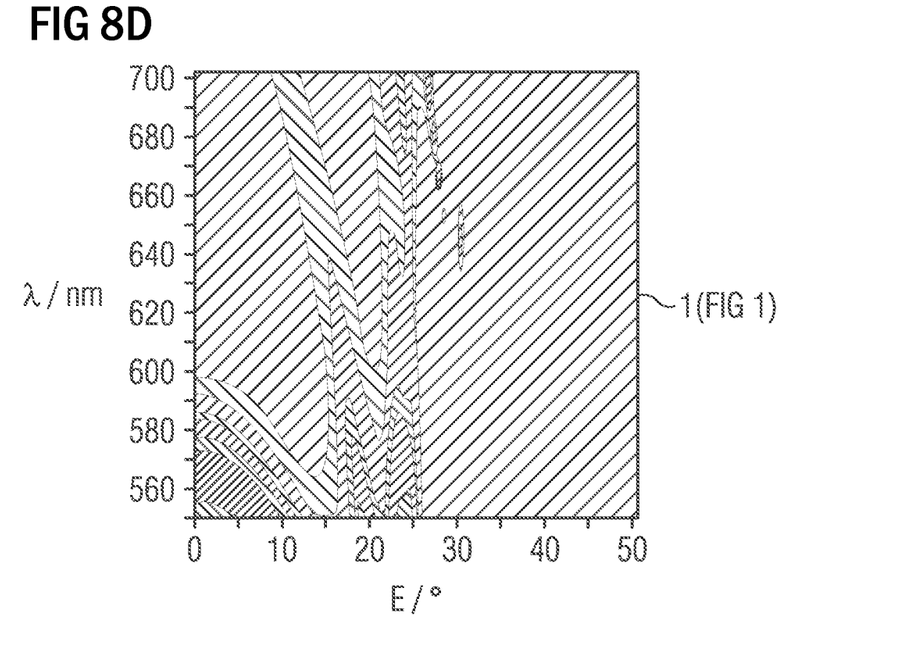

FIG. 8D shows the reflectivity for the exemplary embodiment of the semiconductor chip 1 according to FIG. 1.

Figure 8E:
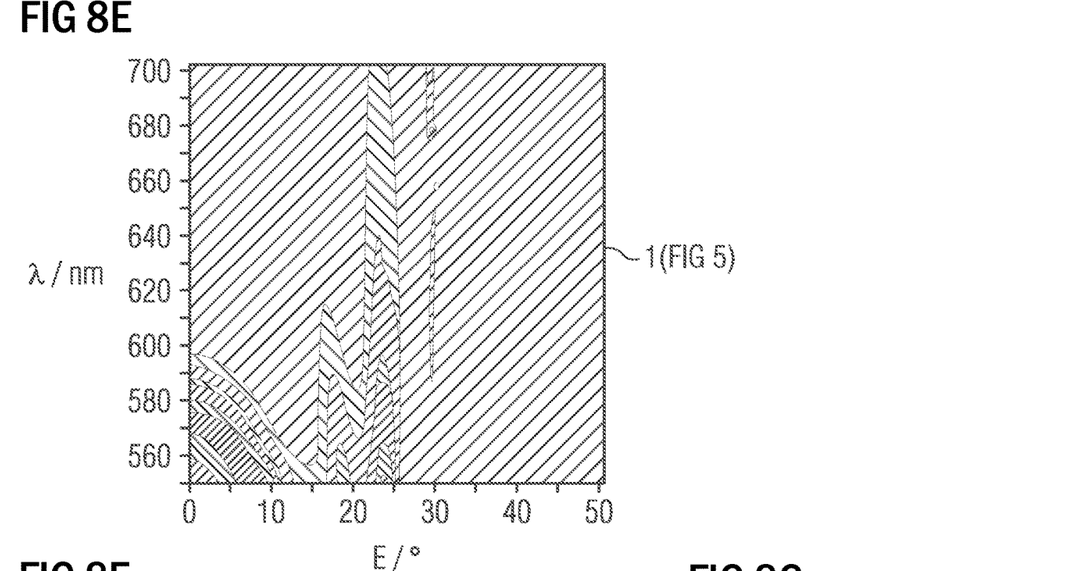

FIG. 8E shows the reflectivity R for the exemplary embodiment of the semiconductor chip 1 shown FIG. 5.

Figure 8F:
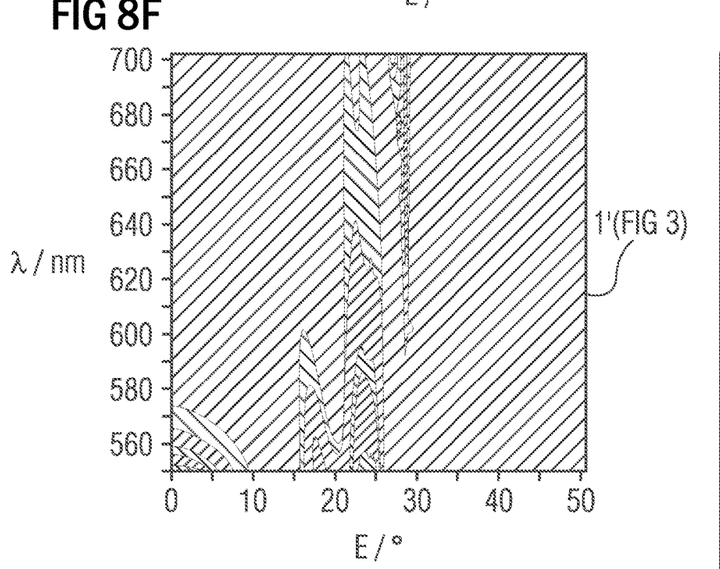
Figure 8G:
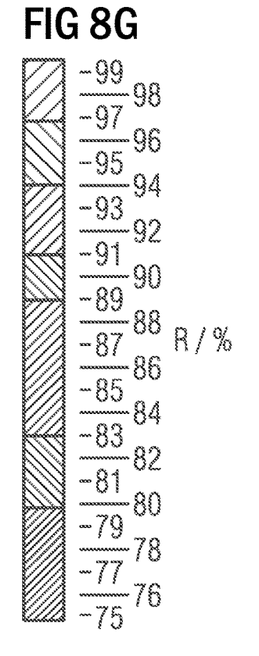

Finally, FIG. 8F shows the reflectivity R for the modification 1' of FIG. 3.

FIGS. 8D and 8E in particular show that a uniformly high reflectivity R can be achieved down to comparatively small angles of incidence E, in contrast to FIGS. 8B and 8C. Furthermore, a considerably lower spectral dependence of the reflectivity R can be achieved, in particular at longer wavelengths above 600 nm.

Due to the strong modulation of the reflectivity R, as shown in FIGS. 8B and 8C, the larger number of layer pairs does not lead to an increased reflectivity overall. This can also be seen in FIG. 7.

Figure 9:
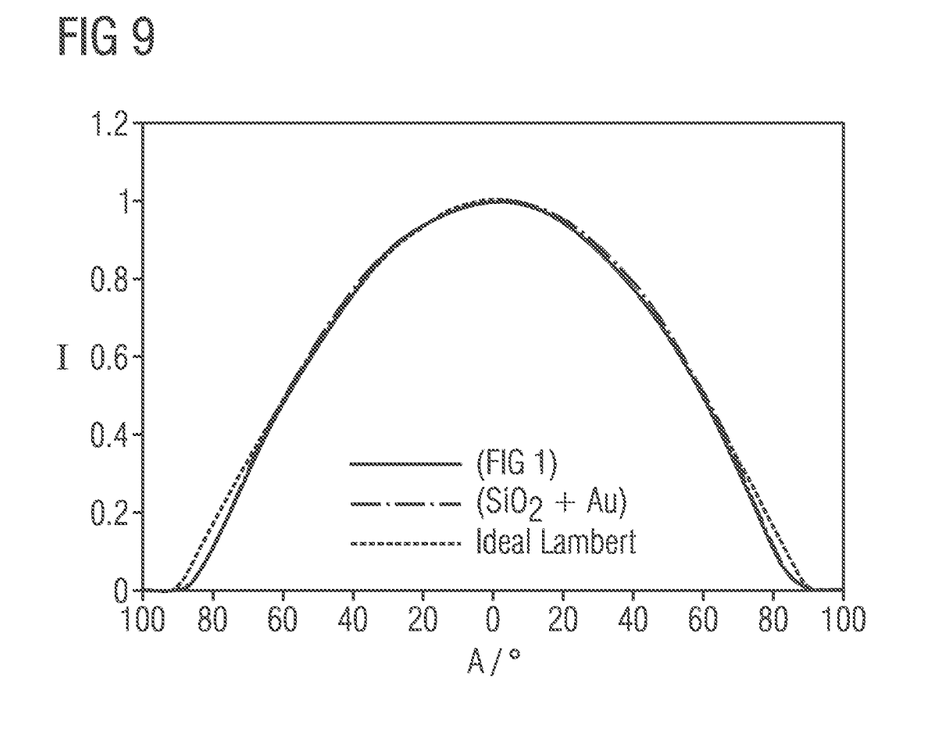
FIG. 9 shows a schematic representation of a dependence of the radiated intensity on a radiation angle, and FIGS. 10 to 14 schematic sectional views of exemplary embodiments of optoelectronic semiconductor chips described here.

In FIG. 9, a radiated intensity I, normalized to one, is plotted against a radiation angle A. The modification 1', as described in FIG. 6, i.e., the design of FIG. 3 without the intermediate layers 32, 33, is compared with the exemplary embodiment of the semiconductor chip 1 of FIG. 1. In addition, an ideal Lambertian radiation pattern is illustrated.

FIG. 9 shows that over a wide range of angles, no deviations between the exemplary embodiment 1 and the modification 1' can be seen. In particular in the angular range between +−70° there are no significant deviations from a Lambertian radiation pattern. The intensity I refers in particular to a luminous flux averaged over all wavelengths.

Figure 10:
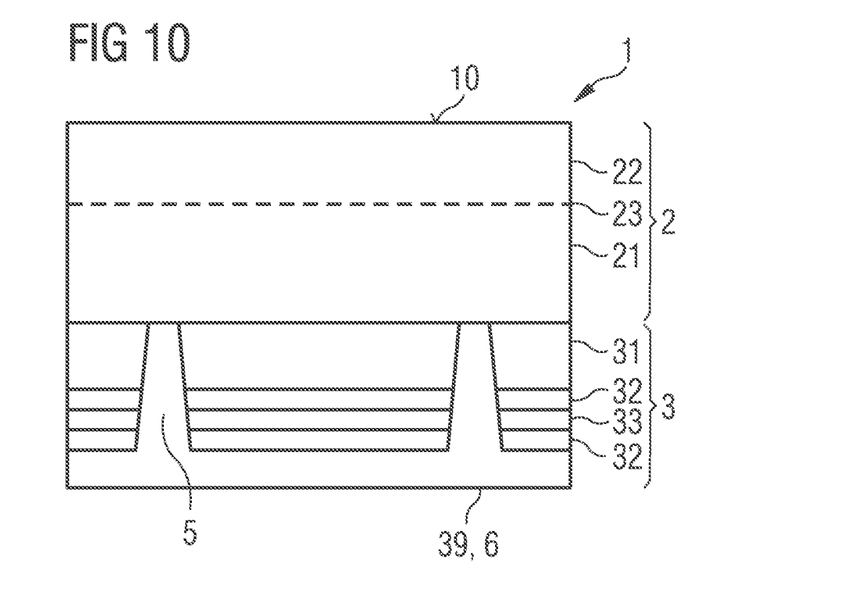

In the exemplary embodiment of the semiconductor chip 1 of FIG. 10, several electrical through-connections 5 are formed through layers 31, 32, 33 of the mirror 3. The through-connections 5 are preferably metallic through-connections. Via the through-connections 5 the semiconductor layer sequence 2 is electrically connected to the metal layer 39 of the mirror 3. The metal layer 39 thus represents a part of an electrode 6 for supplying the semiconductor chip 1 with current.

The through-connections 5 are, for example, trapezoidal in cross section and may optionally become narrower in a direction towards the semiconductor layer sequence 2. Alternatively, the through-connections 5 can also be rectangular in cross-section.

Figure 11:
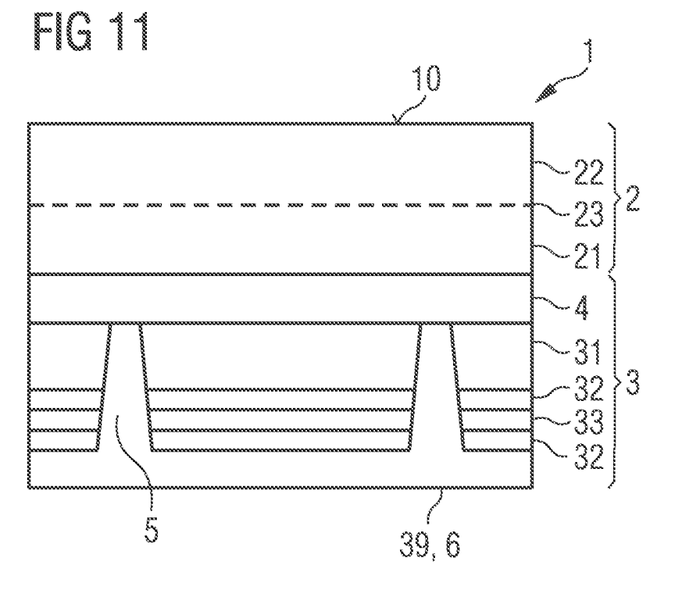

The exemplary embodiment of FIG. 11 comprises an additional contact layer 4. The contact layer 4 extends over the semiconductor layer sequence 2 and covers the through-connections 5 completely. Outside the through-connections 5 the contact layer may be removed.

The contact layer 4 is preferably made of a transparent conductive oxide such as ITO. A thickness of the contact layer 4 is, for example, between 15 nm and 30 nm and is therefore preferably so thin that it has no significant influence on the optical properties of the mirror 3 and/or the semiconductor chip 1. Such a contact layer 4 is preferably also present in the examples of FIGS. 1, 4 and 5. If the contact layer 4 has a greater thickness and becomes optically effective, the thicknesses of the cover layer 31 and the intermediate layers 31, 32, 33, 34 may have to be adjusted accordingly to achieve maximum reflectivity.

Figure 12:
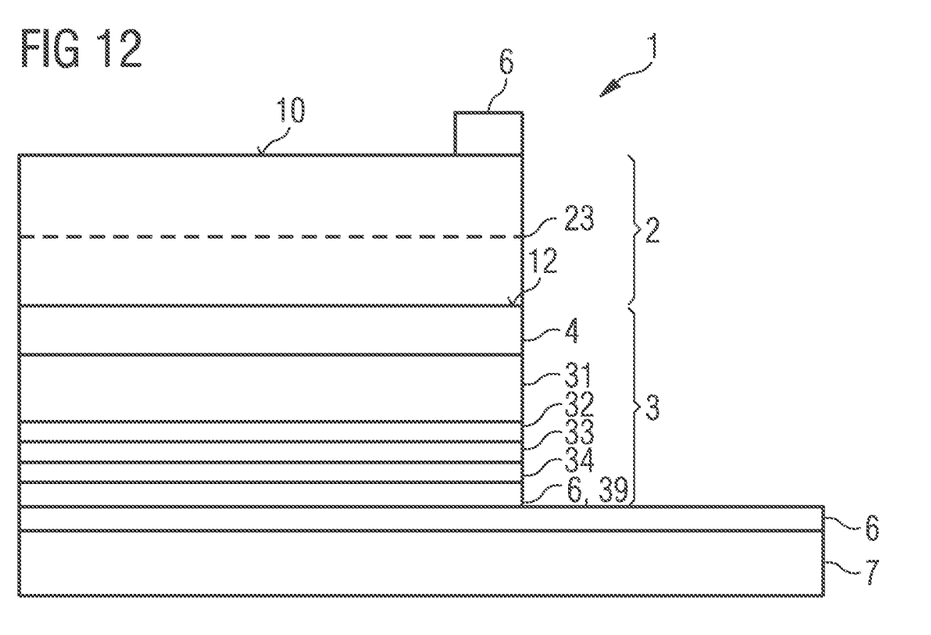

FIG. 12 illustrates that the cover layer 31 and the intermediate layers 32, 33, 34 extend over the entire surface of the metal layer 39. The layers 31, 32, 33, 34 are preferably made of an electrically conductive material such as a transparent conductive oxide. This means that through-connections, as shown in FIG. 10 or 11, are not necessary. The contact layer 4 can also be omitted.

One electrode 6 is located on the light extraction side 10 and may be connected to a current expansion structure, which is not drawn here. The metal layer 39 of the mirror 3 can be located on an electrode 6 on a carrier 7. Over regions of the electrode 6 next to the semiconductor layer sequence 2, an external electrical contact is optionally possible, for example via bonding wires. The electrode 6 on the light extraction side 10 can also be contacted, for example, via a bonding wire. If the carrier 7 is electrically conductive, a bond wire-free contact can be achieved from the side with the metal layer 39.

The further electrode 6 on the light extraction side 10 is not illustrated in FIGS. 10 and 11. Flip-chip designs are also possible in deviation from the illustrations in FIGS. 10 to 12.

Figure 13:
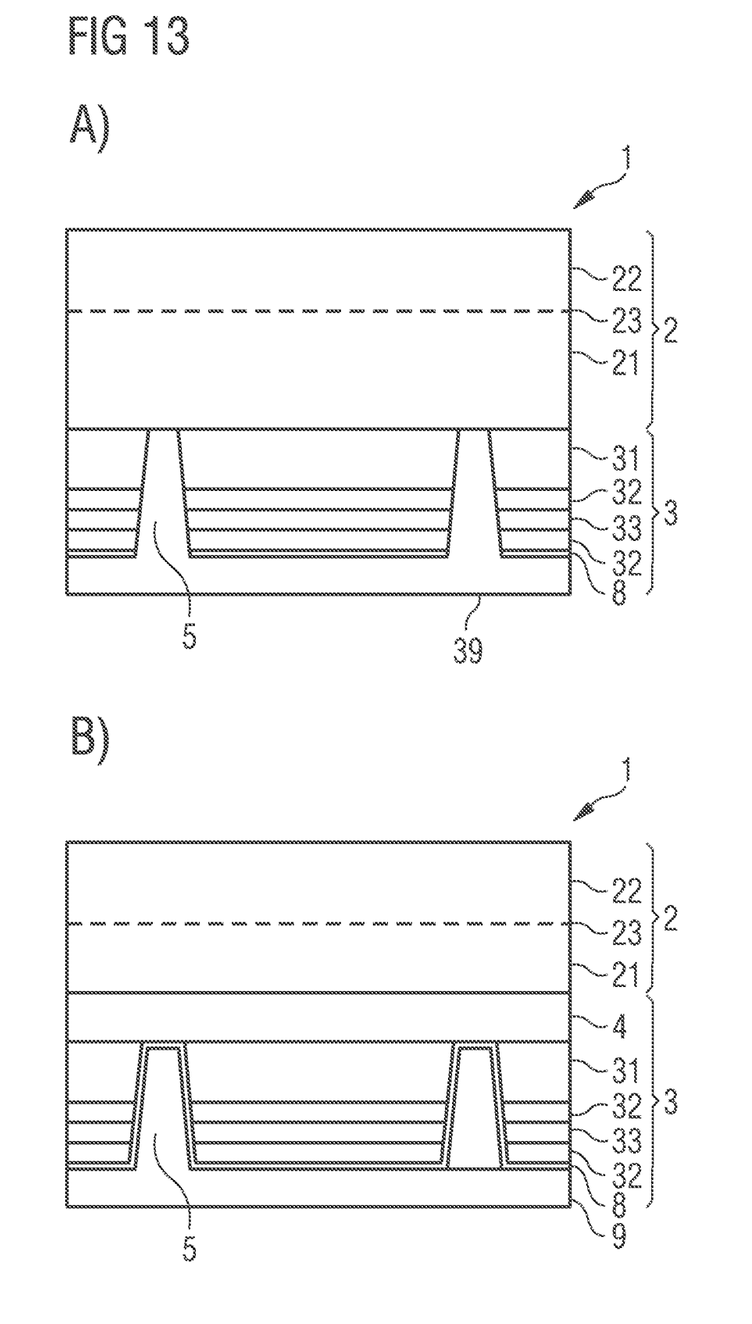

The exemplary embodiments of FIGS. 13A to 13C, each comprises an additional adhesion promoting layer 8, which is located between the metal layer 39 and the intermediate layer, which is directly on the metal layer 39. According to FIG. 13B, the adhesion promoting layer layer 8 extends continuously over the metal layer 39 and also completely covers the through-connections 5, so that the through-connections 5 are overmoulded by the adhesion promoting layer 8. In FIG. 13A, however, the adhesion promoting layer 8 is confined to the boundary between the metal layer 39 and the nearest intermediate layer 32.

In addition, FIG. 13B shows that contact layer 4 is present in addition to the adhesion promoting layer 8. The adhesion promoting layer 8 and the contact layer 4 may be of the same or different materials.

In FIG. 13C, the adhesion promoting layer 8 is designed as illustrated in FIG. 13A. Additionally, the contact layer 4 is also present.

The adhesion promoting layer 8 is preferably made of a transparent conductive oxide like ITO. A thickness of the adhesion promoting layer 8, for example, is between 1 nm and 20 nm and is therefore preferably so thin that the adhesion promoting layer 8 is optically ineffective and has no or no significant influence on the optical properties of the mirror 3 and/or the semiconductor chip 1.

An adhesion promoting layer 8, as shown in FIGS. 13A to 13C, is preferably also present in all other exemplary embodiments.

Figure 14:
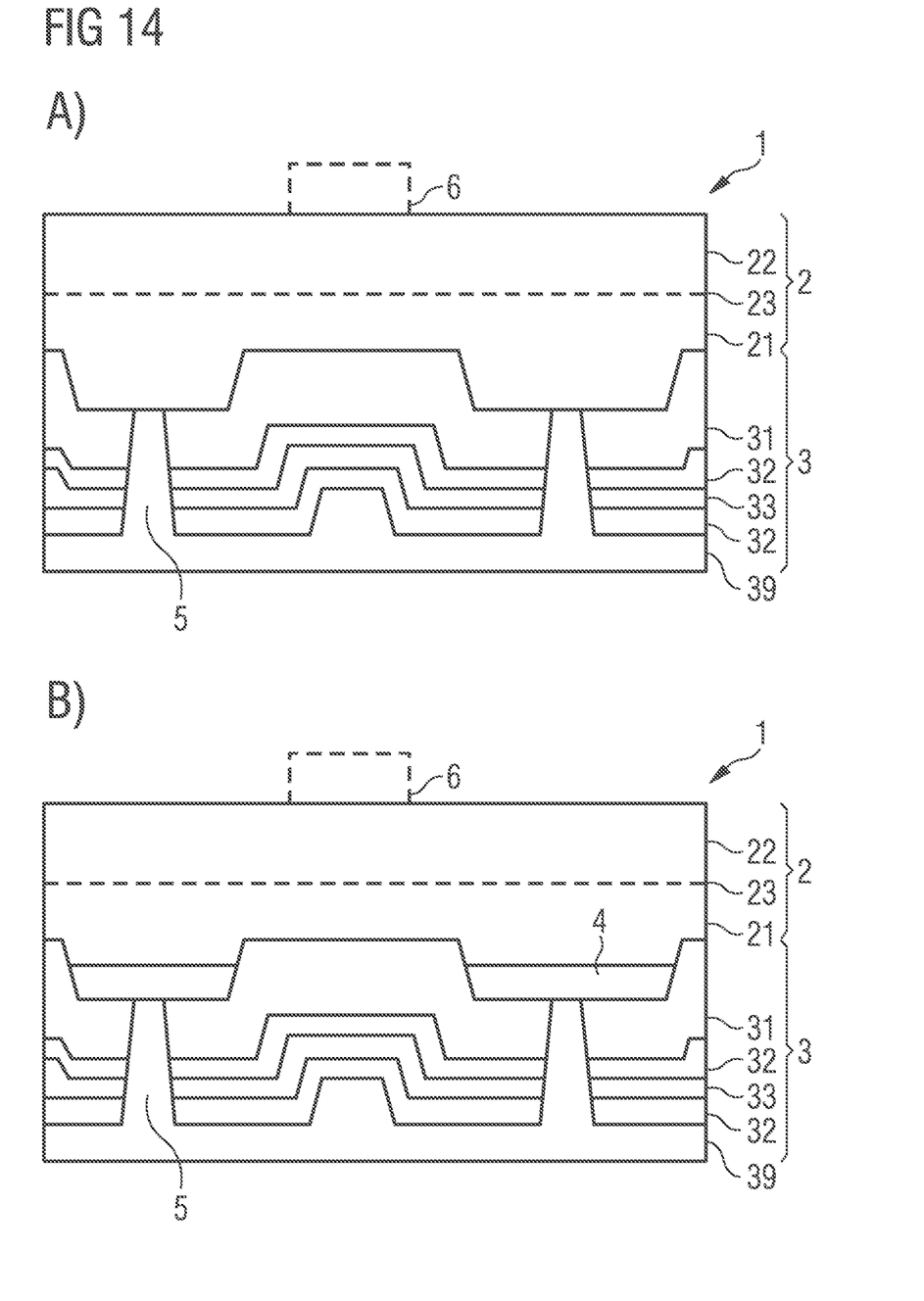

FIGS. 14A and 14B each show that the semiconductor layer sequence 2 of semiconductor chip 1 is structured. The through-connections 5 are preferably located in regions of the semiconductor layer sequence 2 which are thicker than other regions. This structuring of the semiconductor layer sequence 2 may prevent that the active zone 23 is supplied with current directly below the electrode 6. The electrode 6 directly at the semiconductor layer sequence 2 is formed, for example, by current distribution ridges. In addition, such a structuring may increase the light outcoupling efficiency, since light can be deflected at the structuring. The cover layer 31 and the intermediate layers 32, 33 and also the metal layer 39 reproduce the semiconductor layer sequence 2 true to form. This means that the mirror 3 extends over the surface of the semiconductor layer sequence 2, but is not plan, but reflects the topography of the semiconductor layer sequence 2.

FIG. 14B shows that the contact layer 4 is additionally present. The contact layer 4 is only applied locally, in each case starting from the at least one assigned through-connection 5. In deviation from the illustration in FIG. 14B, it is possible to set where the active zone 23 is to be supplied with current due to the low electrical transverse conductivity of the first side 21 of the semiconductor layer sequence 2. Structuring the semiconductor layer sequence 2 itself can then be omitted.

Unless otherwise indicated, the components shown in the figures follow one another, preferably in the order given. Layers not touching each other in the figures are preferably spaced apart. As far as lines are drawn parallel to each other, the corresponding surfaces are preferably also aligned parallel to each other. Likewise, unless otherwise indicated, the relative positions of the drawn components to each other are correctly shown in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

We claim:

1. An optoelectronic semiconductor chip comprising:
a semiconductor layer sequence having an active zone for generating radiation with a wavelength of maximum intensity L; and
a mirror for the radiation on a rear side opposite a light extraction side, wherein
the mirror comprises a cover layer located closest to the semiconductor layer sequence,
the cover layer is formed with a material transparent to the radiation and has an optical thickness between 0.5 L and 3 L inclusive,
the cover layer is followed by between inclusive 2 and inclusive 10 intermediate layers in a direction away from the semiconductor layer sequence,
the intermediate layers have alternately high and low refractive indices for the radiation and are each made of a material transparent to the radiation,
the intermediate layers are followed in the direction away from the semiconductor layer sequence by at least one metal layer as a reflection layer,
the mirror is located on a p-doped side of the semiconductor layer sequence, and
a plurality of electrical connections extend through the mirror for electrically contacting the p-doped side.

2. The optoelectronic semiconductor chip according to claim 1, wherein a thickness of at least one of the intermediate layers is unequal to L/4.

3. The optoelectronic semiconductor chip according to claim 1, wherein at least 50% of the intermediate layers have an optical thickness of L/3, with a tolerance of not more than L/15.

4. The optoelectronic semiconductor chip according to claim 1, wherein
the mirror comprises three or four of the intermediate layers and
the intermediate layers each have an optical thickness of L/3, with a tolerance of at most L/20.

5. The optoelectronic semiconductor chip according to claim 1, wherein the mirror comprises at most two intermediate layers with an optical thickness of (L/4+N/2)+/−L/20, wherein N is a natural number greater than or equal to zero.

6. The optoelectronic semiconductor chip according to claim 1, wherein the cover layer has an optical thickness between 1.1 L and 1.6 L, inclusive.

7. The optoelectronic semiconductor chip according to claim 1, wherein high refractive index layers each have an optical thickness between 0.3 L and 0.4 L, inclusive and an intermediate low refractive index layer has an optical thickness between 0.26 L and 0.35 L, inclusive.

8. The optoelectronic semiconductor chip according to claim 1,
wherein an optical thickness of at least three of the intermediate layers increases in a direction away from the cover layer, and
wherein a difference in optical thickness between adjacent ones of the intermediate layers is between 0.03 L and 0.15 L, inclusive.

9. The optoelectronic semiconductor chip according to claim 1,
wherein the cover layer is of $SiO_2$ and/or the intermediate layers are alternately of $Nb_2O_5$ and $SiO_2$, and
wherein the metal layer is of gold, silver or aluminum.

10. The optoelectronic semiconductor chip according to claim 1, wherein the semiconductor layer sequence is based on AlInGaAs or on InGaAlP and/or the wavelength of maximum intensity L is between 570 nm and 950 nm inclusive.

11. The optoelectronic semiconductor chip according to claim 1, wherein the cover layer is followed three or four intermediate layers in a direction away from the semiconductor layer sequence.

* * * * *